(12) United States Patent
Hoshino et al.

(10) Patent No.: US 8,501,140 B2
(45) Date of Patent: Aug. 6, 2013

(54) METHOD AND APPARATUS FOR PURIFYING METALLURGICAL SILICON FOR SOLAR CELLS

(76) Inventors: Masahiro Hoshino, Los Altos, CA (US); Cheng C. Kao, Los Altos, CA (US)

( * ) Notice: Subject to any disclaimer, the term of this patent is extended or adjusted under 35 U.S.C. 154(b) by 0 days.

(21) Appl. No.: 13/536,919

(22) Filed: Jun. 28, 2012

(65) Prior Publication Data

US 2012/0279439 A1 Nov. 8, 2012

Related U.S. Application Data

(63) Continuation of application No. 13/187,282, filed on Jul. 20, 2011, now Pat. No. 8,236,266.

(30) Foreign Application Priority Data

Jul. 21, 2010 (CN) .................................. 99 1 23949

(51) Int. Cl.
*C01B 33/021* (2006.01)
(52) U.S. Cl.
USPC .......................................... 423/349; 423/348
(58) Field of Classification Search
USPC ..................... 423/345–350; 422/906; 204/164
See application file for complete search history.

(56) References Cited

U.S. PATENT DOCUMENTS

| | | | |
|---|---|---|---|
| 4,298,423 A | 11/1981 | Lindmayer | |
| 4,865,643 A | 9/1989 | Goins et al. | |
| 4,940,486 A | 7/1990 | Sommerville et al. | |
| 5,104,096 A | 4/1992 | Goins et al. | |
| 5,182,091 A | 1/1993 | Yuge et al. | |
| 5,700,308 A | 12/1997 | Pal et al. | |
| 5,961,944 A | 10/1999 | Aratani et al. | |
| 5,989,021 A | 11/1999 | Sato et al. | |
| 6,090,361 A | 7/2000 | Baba et al. | |

(Continued)

FOREIGN PATENT DOCUMENTS

| | | |
|---|---|---|
| JP | 05-262512 A | 10/1993 |
| JP | 2001-526171 A | 12/2001 |

(Continued)

OTHER PUBLICATIONS

Ciftja et al, "Refining and Recycling of Silicon: A Review" Norwegian University of Science and Technology 2008, pp. 1-40.*

(Continued)

*Primary Examiner* — Steven Bos
*Assistant Examiner* — Justin Bova

(57) ABSTRACT

A method improves yield of an upgraded metallurgical-grade (UMG) silicon purification process. In the UMG silicon purification process, in a reaction chamber, purification is performed on a silicon melt therein by one, all or a plurality of the following techniques in the same apparatus at the same time. The techniques includes a crucible ratio approach, the addition of water-soluble substances, the control of power, the control of vacuum pressure, the upward venting of exhaust, isolation by high-pressure gas jet, and carbon removal by sandblasting, thereby reducing oxygen, carbon and other impurities in the silicon melt, meeting a high-purity silicon standard of solar cells, increasing yield while maintaining low cost, and avoiding EMF reduction over time. An exhaust venting device for the purification process allows exhaust to be vented from the top of the reactor chamber, thereby avoiding backflow of exhaust into the silicon melt and erosion of the reactor.

20 Claims, 9 Drawing Sheets

U.S. PATENT DOCUMENTS

| | | | |
|---|---|---|---|
| 6,143,073 | A | 11/2000 | Christman et al. |
| 6,994,835 | B2 | 2/2006 | Sasatani et al. |
| 7,686,887 | B2 | 3/2010 | Ohama et al. |
| 8,236,265 | B2 | 8/2012 | Hoshino et al. |
| 8,257,492 | B2 | 9/2012 | Hoshino et al. |
| 2006/0048698 | A1 | 3/2006 | Hall et al. |
| 2006/0054081 | A1 | 3/2006 | Lan et al. |
| 2008/0123715 | A1* | 5/2008 | Trassy et al. ............ 423/348 |
| 2008/0311020 | A1 | 12/2008 | Ito et al. |
| 2009/0130014 | A1 | 5/2009 | Fukuyama et al. |
| 2010/0178195 | A1 | 7/2010 | Yamada et al. |

FOREIGN PATENT DOCUMENTS

| | | |
|---|---|---|
| JP | 2007326749 A | 12/2007 |
| JP | 2008-308383 A | 12/2008 |
| JP | 2010-269992 A | 12/2010 |
| KR | 10-0966755 B1 | 6/2010 |
| WO | WO 2008/149985 A1 | 12/2008 |

OTHER PUBLICATIONS

Office Action and List of References cited by the Examiner for U.S. Appl. No. 12/947,777 mailed Jan. 27, 2012 from the United States Patent and Trademark Office.

Office Action and List of References cited by the Examiner for U.S. Appl. No. 12/947,777 mailed Jun. 5, 2012 from the United States Patent and Trademark Office.

Office Action and List of Refernces cited by the Examiner for U.S. Appl. No. 13/024,292 mailed Mar. 21, 2012 from the United States Patent and Trademark Office.

International Search Report for PCT/US2011/044890, filed Jul. 21, 2011.

Written Opinion for PCT/US2011/044890 filed on Jul. 21, 2011.

International Search Report for PCT/US2011/024572 filed on Feb. 11, 2011.

Written Opinion for PCT/US2011/024572 filed on Feb. 11, 2011.

Office Action and List of References cited by the Examiner for U.S. Appl. No. 13/024,292 mailed Oct. 27, 2011 from the United States Patent and Trademark Office.

N. Yuge et al., "Purification of Metallurgical-Grade Silicon up to Solar Grade", Progress in Photovoltaics, May/Jun. 2001, pp. 203-209, vol. 9-3.

International Search Report for PCT/US2010/056903 filed on Nov. 16, 2010.

Written Opinion for PCT/US2010/056903 filed on Nov. 16, 2010.

Notice of Allowance for U.S. Appl. No. 13/187,282 mailed Apr. 27, 2012 from the United States Patent and Trademark Office.

Office Action and List of References cited by the Examiner for U.S. Appl. No. 13/187,282 mailed Mar. 23, 2012 from the United States Patent and Trademark Office.

Office Action and List of References cited by the Examiner for U.S. Appl. No. 13/187,282 mailed Dec. 9, 2011 from the United States Patent and Trademark Office.

Liang et al., "Study on the recycle of solar grade silicon from waste IC wafers", Proceedings of ISES Solar World Congress 2007: Solar Energy and Human Settlement, pp. 1189-1193.

Khattak et al., "Production of Solar Grade Silicon by Refining Liquid Metallurgical Grade Silicon", National Renewable Energy Laboratory, Apr. 19, 2001, NREL/SR-520-30716.

Office Action from the U.S. Patent Office, dated Sep. 20, 2012, for U.S. Appl. No. 13/023,467.

Office Action from the U.S. Patent Office, dated Dec. 7, 2012, for U.S. Appl. No. 13/541,319.

Office Action from the U.S. Patent Office, dated Jan. 25, 2013, for U.S. Appl. No. 13/023,467.

Notice of Allowance for U.S. Appl. No. 13/023,467 dated Apr. 18, 2013.

* cited by examiner

METHOD AND APPARATUS FOR PURIFYING METALLURGICAL SILICON FOR SOLAR CELLS

CROSS-REFERENCES TO RELATED APPLICATIONS

This application is a continuation of U.S. non-provisional application Ser. No. 13/187,282, filed on Jul. 20, 2011, which claims priority to Chinese application No. 099123949, filed on Jul. 21, 2010, both of which are incorporated by references in its entirety herein for all purposes.

FIELD OF THE INVENTION

The present invention relates to techniques for growing ultra-pure silicon material. In particular, the present invention provides a method and device for improving the yield of the upgraded metallurgical-grade silicon (UMGSi) purification process and, more particularly, to techniques used in the UMGSi purification process for improving product quality and yield. Merely by way of example, the present method and material can be applied to photovoltaic cells, semiconductor integrated circuits, and other silicon based devices.

BACKGROUND OF THE INVENTION

It is well known that metallurgical silicon can be obtained by heating, in a high-temperature environment, silica (quartz) and the element carbon extracted from coal, petroleum or the like. However, the purity of such metallurgical silicon is approximately 99% (2N). Thus, it is normally used as the starting material for further purification and refinement such that it reaches a purity of 99.9999% (6N)~99.999999999% (11N), suitable for use in solar cells as high-purity silicon, which is often difficult to achieve.

Traditional purifying/refining methods can be roughly divided into two types: one type typified by the commonly called "Siemens" method and the other typified by the Upgraded Metallurgical-Grade (UMG) silicon production process. For the Siemens method, the quality of the resulting product is good and the process is well established, but it has the disadvantages of high production cost and requiring the use or production of poisonous materials.

As for UMG silicon, although the purity is lower than in the Siemens method, the cost is lower and the process does not produce or use poisonous materials. Traditional UMG silicon production processes use the following techniques for providing inexpensive silicon:

1. Slag formation;
2. One-directional cooling;
3. Vacuum vaporization; or
4. A combination of the above.

Using the above techniques and metallurgical silicon with a purity of 2N as the starting material, the silicon product can reach a purity of 6N, which is still not pure enough for solar cell applications.

Therefore, UMG silicon (UMG-Si) with a purity of 6N is then used as the raw material for further purification using single-crystal and/or ingot casting methods to obtain ingots in a shape suitable for solar cell applications.

However, when examining solar cells produced using UMG-Si as the raw material, it is found that its electromotive force (EMF) varies (decreases) over time in actual usage.

Thus, silicon produced using metallurgical methods is inexpensive but has the shortcoming that its EMF changes over time.

To overcome this problem, UMG-Si and high-purity silicon (e.g., made by the Siemens method) are combined to lessen the time-varying EMF problem. Yet, such an approach does not solve the root cause but rather is an expedient measure.

Despite using Floating Zone (FZ) or Czochralski (CZ) methods on UMG-Si to increase its purity, oxygen contained in the silicon will have an adverse effect on the EMF. In addition, when the amount of oxygen contained is large, crystalline defects will occur even if the amount of impurities (e.g., carbon, iron, copper, and nickel) contained is low. As a result, the EMF of the silicon product will be decreased over time.

Therefore, excess oxygen contained in traditional UMG-Si is the main cause for crystalline defects, and should be reduced. Meanwhile, other impurities contained in the silicon must also be minimized for purification/refinement purposes.

SUMMARY OF THE INVENTION

According to the present invention, techniques for growing ultra-pure silicon material are provided. In particular, the present invention provides a method and device for improving the yield of the upgraded metallurgical-grade silicon (UMGSi) purification process and, more particularly, to techniques used in the UMGSi purification process for improving product quality and yield. Merely by way of example, the present method and material can be applied to photovoltaic cells, semiconductor integrated circuits, and other silicon based devices.

In a specific embodiment, the present invention provides a method for forming high quality silicon material for photovoltaic devices substantially free from oxygen or other oxygen containing impurities. The method includes transferring a raw silicon material (e.g., metallurgical Si) and containing carbon impurities to a crucible having an interior region. The crucible is made of a quartz material, which is capable of withstanding a temperature greater than 1400° C. The method includes subjecting the raw silicon material in the crucible to thermal energy to cause the raw silicon material to be melted into a liquid state to form a melted material at a temperature of less than about 1400° C. The melted material has an exposed region bounded by the interior region of the crucible in a specific embodiment. The method includes subjecting an exposed inner region of the melted material to an energy source comprising an arc heater configured above the exposed region and spaced by a gap between the exposed region and a muzzle region of the arc heater to cause formation of determined temperature profile within a vicinity of an inner region of the exposed melted material while maintaining outer regions of the melted material at a temperature below a melting point of the quartz material of the crucible. The method also includes maintaining the crucible during the subjecting the exposed inner region of the melted material to the energy source in a substantially motionless state. Preferably, an outer region of the melted material is substantially free from a mixing action in a specific embodiment. The method includes maintaining a resulting oxygen concentration within the exposed inner region to a predetermined concentration using at least the substantially motionless state of the crucible and causing an interaction with at least one of the carbon species with at least two of an oxygen species from the resulting oxygen concentration to form a gaseous carbon dioxide. The method includes removing the gaseous carbon dioxide from the exposed inner region of the melted material and removing one or more other impurities from the melted material to form a higher purity silicon material in the crucible. Preferably, the substantially motionless state is provided between a boundary between the inner region of the crucible and the outer region of the melted material such that the boundary is substantially free from the mixing action.

Preferably, the method includes outputting an inert gas through a nozzle region to cause a dimple region within a vicinity of the center region of the melted material. The method also has a resulting oxygen concentration within the exposed inner region to about 0.5 E 15 atoms/cm3. The saturation concentration of O in molten Si is 1 E 16 atoms/cm3; the oxygen concentration in the crucible being a substantial constant value. The substantially motionless state is characterized by a substantially constant temperature profile within a vicinity of the boundary between the inner region of the crucible and the outer region of the melted material.

In a specific embodiment, the inert gas comprises an argon gas characterized by a flow rate suitable to form the dimple region comprising a plurality of recessed regions each of which is separated by an elevated region. Preferably, the method also maintains a motionless boundary region between the exposed inner region and the interior region of the crucible. The resulting oxygen concentration is derived from an oxygen species. In a specific embodiment, the nozzle region is coupled to an argon gas source, the nozzle region comprising a ceramic material. In a specific embodiment, the dimple region provides an increased surface region for a plume to interact with the melted material. The dimple region has a depth of at least one centimeter.

In a specific embodiment, the melted material comprises a viscosity of 0.7 Pascal-second. In a specific embodiment, the melted material comprises a silicon material and a phosphorous species. The melted material comprises a resulting phosphorous species of 1 ppm and less. In a specific embodiment, the method also includes the removing of the gaseous carbon dioxide species occurs in an upward manner to prevent remixing of the gaseous carbon dioxide species with a portion of the melted. The removing is provided by a pumping device configured to be able to form a pressure gradient to a lower value to prevent remixing of the gaseous carbon dioxide species. In a specific embodiment, the method includes providing a cover gas to maintain the melted material within the crucible. The crucible comprises a width and a depth to facilitate a mixing action within the exposed inner region and reduce a mixing action within the exposed outer region of the melted material; wherein the depth to the width has an aspect ratio of 2:1 (depth:width) and greater in a specific embodiment. The method includes providing a carrier gas configured to cause a portion of evaporated melted material to return to the melted material. The method also includes using a plurality of surface regions to cause a substantial portion of a phosphorus species to be exhausted while returning a substantial portion of silicon species into the melted material.

In an alternative specific embodiment, the present invention provides a method for forming high quality silicon material for photovoltaic devices substantially free from the impurity carbon. The method includes transferring a raw silicon material and a plurality of carbon species in a crucible having an interior region. The crucible is made of a quartz material, the quartz material being capable of withstanding a temperature greater than 1400° C. The method includes subjecting the raw silicon material in the crucible to thermal energy to cause the raw silicon material to be melted into a liquid state to form a melted material at a temperature of less than about 1400° C. The melted material has an exposed region bounded by the interior region of the crucible in a specific embodiment. The method includes subjecting an exposed inner region of the melted material to an energy source comprised of an arc heater configured above the exposed region and spaced by a gap between the exposed region and a muzzle region of the arc heater to cause formation of determined temperature profile within a vicinity of an inner region of the exposed melted material while maintaining outer regions of the melted material at a temperature below a melting point of the quartz material of the crucible. The method includes applying an inert gas to apply a pressure at a first determined value to the exposed inner region of the melted material and cause a resulting oxygen concentration within the exposed inner region to a predetermined concentration and increasing the pressure from the first determined value to a second determined value to increase the resulting oxygen concentration from a first oxygen value to a second oxygen value. The method includes causing an interaction with at least one of the carbon species with at least two of an oxygen species from the resulting oxygen concentration to form a gaseous carbon dioxide and removing the gaseous carbon dioxide from the exposed inner region of the melted material to thereby reduce the resulting concentration of the plurality of carbon species.

In a specific embodiment, the present invention provides that the crucible is maintained in a substantially motionless state to maintain a boundary region between the inner region of the crucible and the exposed inner region of the melted material. The method also includes the exposed inner region of the melted material is characterized by the resulting concentration of the plurality of carbon species to less than 1 parts per million. The exposed inner region of the melted material has a resulting oxygen concentration of 0.5 E 14 atoms/cm3. The source of the carbon in the raw material is from the tar, coal, or charcoal used in its production. In a specific embodiment, the second pressure is about 50 Torr and wherein the first pressure is about 1 Torr. In an alternative embodiment, the first pressure of about 1 Torr causes a boiling action within the exposed inner region of the melted material.

Still further, the present invention provides a method for forming high quality silicon material for photovoltaic devices. The method includes transferring a raw silicon material and a plurality of carbon species in a crucible having an interior region, the crucible being made of a quartz material, which is capable of withstanding a temperature of at least 1400° C. The method also includes subjecting the raw silicon material in the crucible to thermal energy to cause the raw silicon material to be melted into a liquid state to form a melted material at a temperature of less than about 1400° C., the melted material having an exposed region bounded by the interior region of the crucible. The method includes subjecting an exposed inner region of the melted material to an energy source comprising an arc heater configured above the exposed region and spaced by a gap between the exposed region and a muzzle region of the arc heater to cause formation of determined temperature profile within a vicinity of an inner region of the exposed melted material while maintaining outer regions of the melted material at a temperature below a melting point of the quartz material of the crucible. The method includes providing a plasma stream having a velocity of greater than 1 meter per second within a vicinity of the exposed inner region of the melted material. In a specific embodiment, the method also includes introducing a water species containing a slagging material into the stream of the plasma and interacting the water species and a portion of the melted material to cause formation of a glass material to absorb one or more metal impurities from the melted material to form a thickness of the glass material in the crucible. In a specific embodiment, the melted material comprises a viscosity of 0.7 Pascal-second. In a specific embodiment, the melted material comprises silicon characterized by a viscosity of 0.7

Pascal-second. Preferably, the method removes the thickness of the glass material after the purification is finished. In a specific embodiment, the thickness of glass material comprises silicon dioxide or aluminum dioxide. In a specific embodiment, the one or more metal impurities is one of copper, iron, manganese, nickel, aluminum, cobalt, chromium, or titanium, combinations thereof, and the like. The thickness of the glass contains $Fe_xO_y$ species. In a specific embodiment, the slag material is selected from at least one of $CaCl_2$ or $MgCl_2$. The slag material is water soluble. Preferably, the water species is $H_2O$ in liquid form or $H_2$ and $O_2$ in gas form. In a specific embodiment, the thickness of the glass material is floating on the melted material.

In one or more embodiments, the method also includes other variations. Preferably, the stream of the plasma is provided by outputting an inert gas through a nozzle region to cause a dimple region within a vicinity of the center region of the melted material. The inert gas comprises an argon gas characterized by a flow rate suitable to form the dimple region comprising a plurality of recessed regions each of which is separated by an elevated region. Preferably, the method also maintains a boundary region between the exposed inner region and the interior region of the crucible. The nozzle region is coupled to an argon gas source. Preferably, the nozzle region comprises a ceramic material. The dimple region provides an increased surface region for a plume to interact with the melted material. Preferably, the dimple region has a depth of at least one centimeter.

In other embodiments, the method also includes providing a cover gas to maintain the melted material within the crucible. The method also includes providing a carrier gas configured to cause a portion of evaporated melted material to return to the melted material. Preferably, the method uses a plurality of surface regions to cause a substantial portion of a phosphorus species to be exhausted while returning a substantial portion of silicon species into the melted material. Preferably, the melted material comprises a silicon material and a phosphorous species. More preferably, the melted material comprises a resulting phosphorous species of 1 ppm and less.

The present invention proposes a method for improving the yield of an upgraded metallurgical-grade (UMG) silicon purification process, in the UMG silicon (UMGSi) purification process, in a reaction chamber, performing purification by one, all, or a plurality of the following means in the same apparatus at the same time, comprising:

a crucible ratio approach, wherein heat circulation is generated by density variations caused by uneven temperature distribution in a silicon melt in a crucible by designing the effective depth of the crucible to be ½ or more of the diameter of a circular crucible or the length of the shortest side of a polygonal crucible, so that a temperature difference can be more easily induced in the silicon melt, thus increasing heat circulation and facilitating stirring within the silicon melt;

the addition of water-soluble substances, wherein calcium chloride ($CaCl_2$) and magnesium chloride ($MgCl_2$) are added into the silicon melt; since calcium (Ca) and magnesium (Mg) have the characteristic of easily combining with other impurities at the polysilicon crystalline grain boundary while Cl has the characteristic of making impurities inert, during oxidation of the silicon melt, the water-soluble substances can be easily combined with silicon oxide and vitrified to form a slag that floats on the surface of the silicon melt along with other impurities, thereby producing high-purity silicon products, eliminating crystalline defects, and reducing issues with the time-varying electromotive force (EMF) of silicon products;

the control of power, wherein by adjusting a heater's output power, that is, by gradually reducing the power to control the cooling temperature of the silicon melt, quartz, which is the main material in the crucible, undergoes a crystalline transformation, so that the solidified silicon after cooling down can be easily removed from the quartz crucible, thus reducing waste of purified silicon and increasing the yield of the purification process; in addition, a material is also optionally coated on a contact interface between the quartz crucible and the silicon melt for protecting the silicon melt against contamination caused by diffusion of oxygen and other impurities;

the control of vacuum pressure, wherein the pressure in the reactor chamber is controlled so that carbon contained in the silicon melt and oxygen released by the quartz crucible combine to form carbon oxide gases (CO and $CO_2$) that can be easily vented outside the chamber, thereby removing oxygen and carbon contained in the silicon melt and also eliminating crystalline defects in silicon products that would otherwise degrade the conversion efficiency of solar cells;

the upward venting of exhaust, wherein exhaust generated in the reactor chamber during the purification process is vented upward and laterally through a venting device on top of the crucible to avoid backflow of carbon oxide exhaust gases (CO and $CO_2$) to the silicon melt, so the carbon content in the silicon melt can be effectively reduced compared to the downward venting method; in addition, water in the exhaust is prevented from contacting and oxidizing carbon components of the reactor and reducing their lifespan;

isolation by high-pressure gas jet, wherein a concentric high-pressure injection device is positioned at an angle above the silicon melt, including an inner tube and an outer tube, wherein the inner tube provides gases and/or materials necessary for purification to the center of the silicon melt, so that impurities in the melt will react and vaporize or form slag floating on the surface of the melt, while the outer tube supplies high-pressure injection gas to the silicon melt to effectively blow the slag away from the surface center, allowing gases and/or materials to be successfully provided to the silicon melt, thereby improving the efficiency of purification;

carbon removal by sandblasting, wherein porous carbon raw material in the form of bubbles solidified and attached to the top of low-purity metallurgical silicon raw material is removed by sandblasting, so as to avoid carbon decomposition and sulfur release from the metallurgical silicon raw material during purification in the crucible and contamination of the apparatus, while at the same time avoiding time-consuming manual filtering, increasing the yield, and reducing product price.

Furthermore, in order to prevent backflow of partially-reacted exhaust into the silicon melt and avoiding oxidation of the carbon components in the chamber by the water in the exhaust, the upward and laterally designed venting device mentioned above is designed to have a V-shape path located on top of the crucible, including a horizontal reflecting part approximately parallel to the surface of the silicon melt at the bottom of the venting device, guiding grooves slanting upward from either end of the horizontal reflecting part, and lateral grooves extending horizontally to either end above the guiding grooves. Through such a design, exhaust is upward and laterally vented out of the reactor through the venting device. Moreover, since the exhaust vented out in this way has a high temperature, it can be efficiently utilized in other applications via heat exchangers, electrical generators, or combinations thereof, thereby increasing the efficiency of the present invention.

With the technical means described above, problems in the present metallurgical silicon purification process can be solved. The crystalline defects induced by oxygen and impurities contained in the silicon are effectively reduced to enable applications of finished products in fields requiring high efficiency, such as solar cells. In addition, the EMF does not degrade over time. Yield is increased by reducing defects and material waste, and cost is kept low while maintaining high quality compared to the silicon manufactured by the Siemens method. Furthermore, the materials, gases, and substances used in the purification process of the present invention are all non-toxic and do not produce toxic by-products, thereby ensuring safety in the manufacturing processes and conforming to environmental standards.

Various additional objects, features and advantages of the present invention can be more fully appreciated with reference to the detailed description and accompanying drawings that follow.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE EMBODIMENTS

According to the present invention, techniques for growing ultra-pure silicon material are provided. In particular, the present invention provides a method and device for improving the yield of the upgraded metallurgical-grade silicon (UMGSi) purification process and, more particularly, to techniques used in the UMGSi purification process for improving product quality and yield. Merely by way of example, the present method and material can be applied to photovoltaic cells, semiconductor integrated circuits, and other silicon based devices. In a specific embodiment, the present invention is described by the following specific embodiments.

The present invention provides a method and device for improving the yield of the metallurgical silicon purification process. As described in the prior art, during a conventional metallurgical silicon purification process, oxygen and other impurities such as carbon in the silicon that are not effectively removed can cause defects in the silicon products which, when used in solar cells, will cause a decrease in conversion efficiency over time. In view of this, a traditional apparatus for manufacturing single-crystal silicon is improved, allowing mass production of metallurgical silicon using the purification process at a lower cost with a quality comparable to the silicon produced by the Siemens method. More importantly, with such improved process, oxygen and other impurities within the silicon melt can be effectively removed, such that the purified silicon meets the high purity standard for solar cell applications while eliminating the disadvantage of a decrease in conversion efficiency in solar cells over time, increasing process yield and avoiding production loss.

The present invention addresses the shortcomings mentioned above by the following technical means: a crucible ratio approach, the addition of water-soluble substances, the control of power, the control of vacuum pressure, the upward venting of exhaust, isolation by high-pressure gas jet, and carbon removal by sandblasting. In the same apparatus and at the same time, purification is carried out using one, all, or a plurality of the technical means.

The first purification means adopted by the present invention is the crucible ratio approach.

Figure 1B:
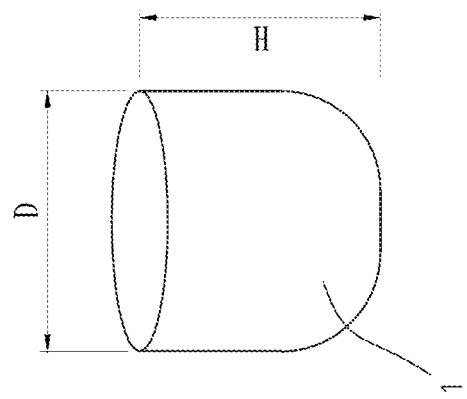
FIG. 1(b) is a diagram illustrating the diameter and depth of a crucible.
Figure 1A:
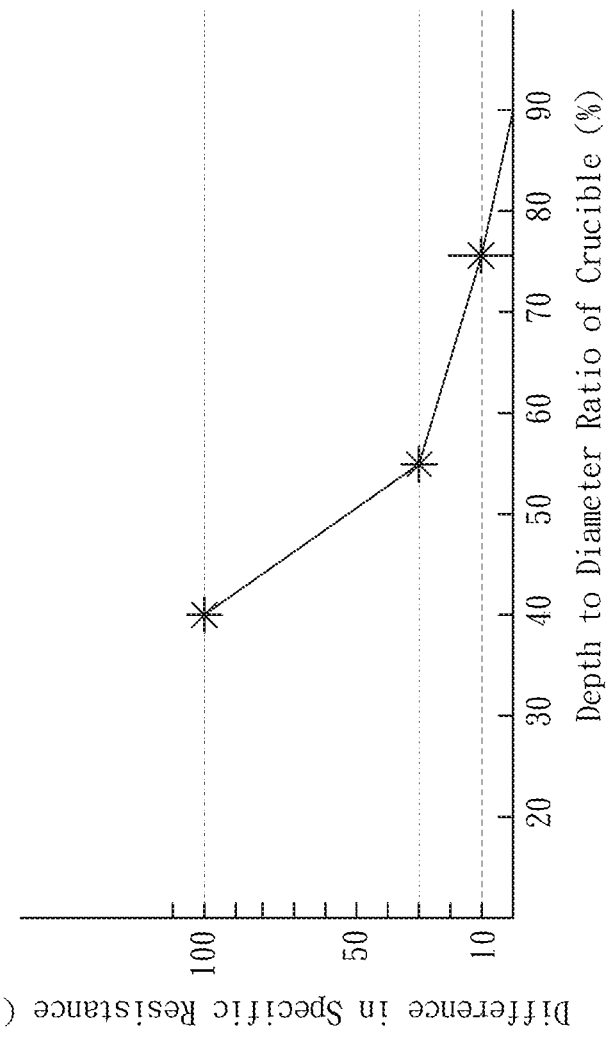
FIG. 1(a) is a graph depicting the depth-to-diameter ratio of a crucible and the specific resistance of a product (namely, the ratio of difference in impurity concentration to the average impurity concentration in %) of the present invention.

FIG. 1(a) is a graph depicting the depth/diameter ratio of a crucible versus specific resistance of the product (namely, the ratio of difference in impurity concentration to the average impurity concentration in %). FIG. 1(b) is a diagram illustrating the depth and diameter ratio of the crucible.

It should be noted first that the purification techniques used in the present invention are the purification method and device disclosed in Taiwan patent Application Nos. 098138830 and 099104551 filed by the same applicant, which are hereby incorporated by reference herein, wherein purification is achieved by heat circulation of the silicon melt in the crucible caused by density variation due to the temperature profile across the silicon melt.

However, a conventional crucible design has a relatively shallow depth with respect to its diameter. The reason is that a traditional purification process uses one-directional cooling purification based on segregation constant theory, so a large crucible depth hinders uniform and complete cooling of the silicon melt therein. In contrast, in the method of single-crystal silicon pulling, the crucible depth is less relevant than is the speed of silicon melt transitioning from liquidus to solidus at the solidus-liquidus interface.

In addition, in order to obtain a uniform density of the silicon melt, a traditional method includes mixing by injecting bubbles from the bottom of the crucible or mechanical mixing by a stirring rod. Although these two mixing methods allow effective stirring, there are still problems to be overcome in actual applications thereof. For example, in the former case, there are problems such as leaking of the silicon melt, the material and connection of a high-pressure air cylinder, and fracture upon cooling; in the latter case, in order to stir at the surface of the high-temperature crucible, there are problems such as contamination of the melt by the material of the stirring rod, the strength of the material under high-temperature operation, and uniformity of stirring.

Compared to the traditional methods, the present invention designs the crucible in such a way that the effective depth is ½ or more of the diameter (in the case of a circular crucible) or the length of the shortest side (in the case of a polygonal crucible), as shown in FIG. 1(b), wherein the effective depth (H) is ½ or more of the diameter (D) of the crucible. In doing so, temperature difference in the melt in the crucible (1) can be more easily obtained, which causes heat circulation and thus stirring/purification of the silicon melt in the crucible (1). If the crucible (1) is shallower, the temperature difference between its top and bottom cannot be widened as much as in a deeper crucible (1). Thus, in terms of circulation, a shallower crucible has poor heat circulation, and a deeper crucible has better heat circulation.

The above conclusion has been proven by experiments done by the inventor using different ratios of crucible depth (H) and diameter (D). The relationship of the depth/diameter ratio and the specific resistance of the product can be seen in FIG. 1(a), wherein the vertical axis indicates the difference in specific resistance (%) (namely, the ratio of difference in impurity concentration to the average impurity concentration in %), and the horizontal axis indicates the ratio of depth to diameter of the crucible.

Experiment One:

A high-purity metallurgical silicon is inserted in a quartz crucible (1) with a diameter (D) of 12 inches and a height (H) of 5 inches, and boron is added to obtain a specific resistance of 10Ω, and then it is heated to 1450° C. In this case, since the permeation of boron into the silicon melt depends only on the concentration gradient, even after two hours, the difference in local resistance is still above 100%.

Experiment Two:

Similar to experiment one, a high-purity metallurgical silicon is inserted in a crucible (1) except its height (H) is changed to 7 inches. In this case, after two hours, the difference in local resistance is reduced to 30%.

Experiment Three:

Similar to experiment one, the high-purity metallurgical silicon is inserted in a crucible (1) except its height (H) is changed to 9 inches. In this case, after two hours, the difference in local resistance is reduced to 10%.

It can be seen from the above experiments that the ratio of the height (H) to the diameter (D) of the crucible significantly affects the circulation (and thus uniformity of stirring) of the melt.

The second purification means adopted by the present invention is the addition of water-soluble substances.

As described in the prior art, in the traditional UMG purification process, one method of purification is the so-called "slag formation": combining impure metal oxide in the melt to form vitrified substances and letting the vitrified substances float on the surface of the melt. However, slag formation has the disadvantage of difficult or incomplete vitrification of the impurities.

In order to remove impurities generated by temperature or compound change in the melt, the inventor observed the effect of water on silicon purification; that is, water can oxidize the metal impurities and form vitrified substances in the silicon melt. For more efficient removal of impurities, the present invention obtains high-purity silicon product by adding substances to the silicon melt, such as calcium (Ca) and magnesium (Mg), which are water-soluble and do not affect the conversion efficiency of the solar cell, and chlorine (Cl), that has been proven to make impurities inert in the manufacturing process of semiconductor devices. In other words, $CaCl_2$ and $MgCl_2$ are added to the silicon melt. Ca and Mg have the characteristic of easily combining with other impurities at the polysilicon crystalline grain boundary, while Cl has the characteristic of making impurities inert. As a result, during oxidation of the silicon melt, these water-soluble substances combine with silicon oxide to form vitrification, floating on the surface of the melt along with other impurities, which can be removed after cooling. This eliminates crystalline defects and reduces the issue of the time-varying EMF of the silicon product.

Simply put, the reasons for using calcium (Ca) and magnesium (Mg) chloride in the present invention are as follows:

1. They are water-soluble, that is, they can more uniformly and easily dissolve in water than powder;

2. The chlorination of impurities in the silicon improves their ability to vaporize from the silicon melt, thereby making purification easy; and 3. In the production process of semiconductor devices, chlorine is often used as an impurity getter, the effect of which is well-known (making impurities inert). It also eliminates crystallization defects.

This technical means has been proven by the inventor through actual experiments.

Conditions:

$CaCl_2$ and $MgCl_2$ of a weight percent of 0.1% are mixed in water to form a solution, and the solution is continuously injected into a 10-kg silicon melt at a speed of 10 cc/min for 2 hours.

Result:

Compared to no addition of water-soluble Ca, Mg, $CaCl_2$ or $MgCl_2$, the distribution of impurities in the silicon is improved from about ±40% to ±10%, and the time-varying EMF conversion efficiency is improved by 50% or greater.

The third purification means adopted by the present invention is the control of power.

Figures 2A, 2B:
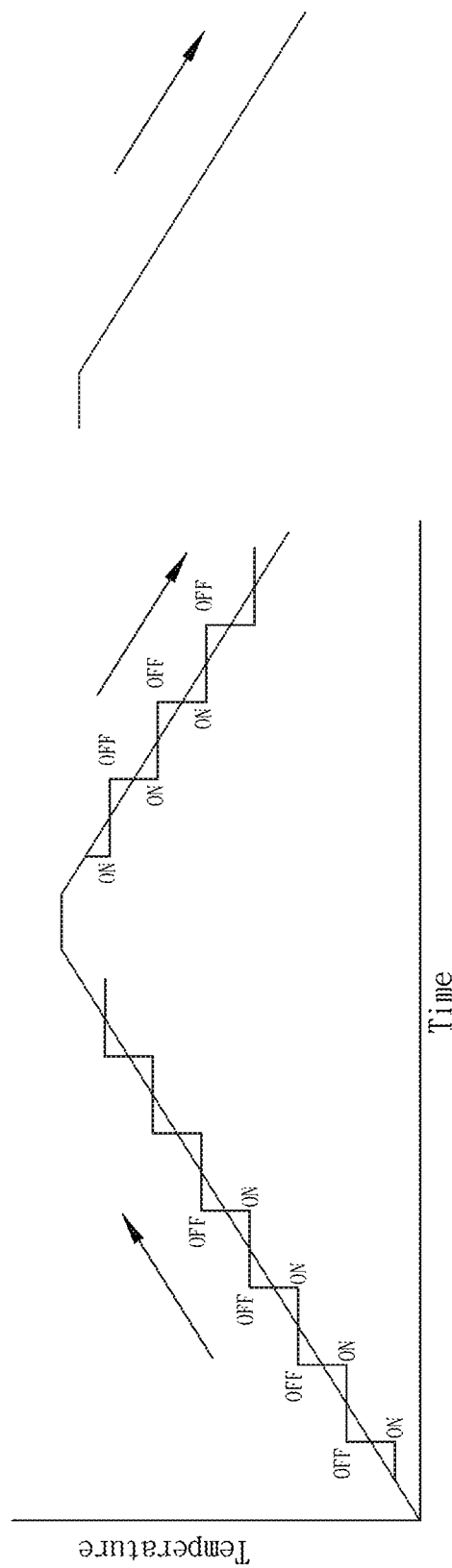
FIG. 2(a) is a graph depicting the temperature curve of a form of prior art that performed programmed control and management of the temperature.
FIG. 2(b) is a drawing showing a temperature curve from using a means to control power according to the present invention.

FIG. 2(a) is a graph illustrating a temperature curve of a form of prior art that performed programmed control and management of the temperature. FIG. 2(b) is a drawing showing a temperature curve using the control of power means according to the present invention.

In the present invention, since the silicon melt is mainly cooled down in the crucible (1), the purified silicon is in the crucible (1). However, the quartz crucible (1) reacts with the silicon melt such that the melt may adhere to the crucible (1) and be difficult to remove from the crucible (1). This reduces the amount of purified silicon product and lowers the yield.

In order to prevent this, usually in one-directional cooling based on segregation in the casting processing, sintered quartz (rather than the ordinary fused quartz) is used as the crucible material, and the inside is coated with silicon nitride powder. However, the impurities contained in silicon nitride may diffuse into and contaminate the silicon melt. After studying the crystallization transformation of quartz in detail, the inventor found that when the lattice constant changes at around 1470° C. corresponding to the crystallization transformation, Cristobalite will transform into Tridymite. In this temperature region, the output power of the heater rather than the temperature is controlled, i.e., power control is performed for cooling. The rate of cooling is very slow at, for example, 0.1~0.01° C./min. Since the expansion coefficient of crystallization transformation of quartz is changed, the solidified silicon can be easily peeled off the quartz crucible (1) even without any silicon nitride. In this way, loss of the purified silicon product can be reduced and yield can be improved. In addition, during the slow cooling process, the silicon melt can be simultaneously purified by one-directional cooling based on segregation.

Moreover, in the present invention, a material that can hinder and control diffusion and melting of oxygen and impurities can also be coated on the contact interface of the silicon melt and the quartz crucible (1) to prevent oxygen or impurities released by the quartz crucible (1) from contaminating the silicon melt. This material can be silicon nitride powder, for example.

Referring to FIGS. 2(a) and 2(b), FIG. 2(a) illustrates a temperature curve with respect to time when cooling the silicon melt using the conventional temperature controlling method (PID temperature control). Since the actual temperature repeatedly overshoots and undershoots as shown in the drawing, that is, due to periodic adjusting of the temperature up and down, the contact interface of the silicon melt and the crucible will be shifted. Oxygen generated from the quartz crucible will continuously diffuse into the melt, and the conversion efficiency of the silicon product will be degraded. Furthermore, crystal growing of the silicon melt is also adversely affected by these temperature variations. In contrast, as shown in FIG. 2(b), using the power controlling method of the present invention, temperature variations are eliminated, which improves the homogeneity of silicon crystal growth and variation in oxygen contained in the silicon.

Moreover, in order to increase the efficiency of the solar cell and the purity of the purified silicon product, it is necessary to reduce the crystalline grain boundary to obtain larger crystalline grains, and to remove vitrified impurities between the grain boundaries.

In order to achieve this, the temperature management for growth of crystalline nuclei and the minimization of grain boundaries is very important. Minimization of grain boundaries is effective for removal of vitrified impurities. The addition of water-soluble chloride substances can improve the removal even further.

For the optimization of crystalline nuclei growth and grain boundary management, and for the effective vaporization of vitrified impurities between grain boundaries, the inventor has found that adding water-soluble chloride substances as previously described and keeping a certain temperature region and/or cooling at a very slow rate can be advantageous. For example, the present invention performs output power control rather temperature control to cool at a very slow rate, for example, 0.1~0.01° C./min. It is also found that this temperature region is most effective at a range of ±40° C. from the solid-liquid interface temperature of the silicon melt. A solar cell made from the silicon product produced in such conditions can increase the efficiency by 1.5% compared to a traditional product, and without reduction of EMF over time.

Figure 3:
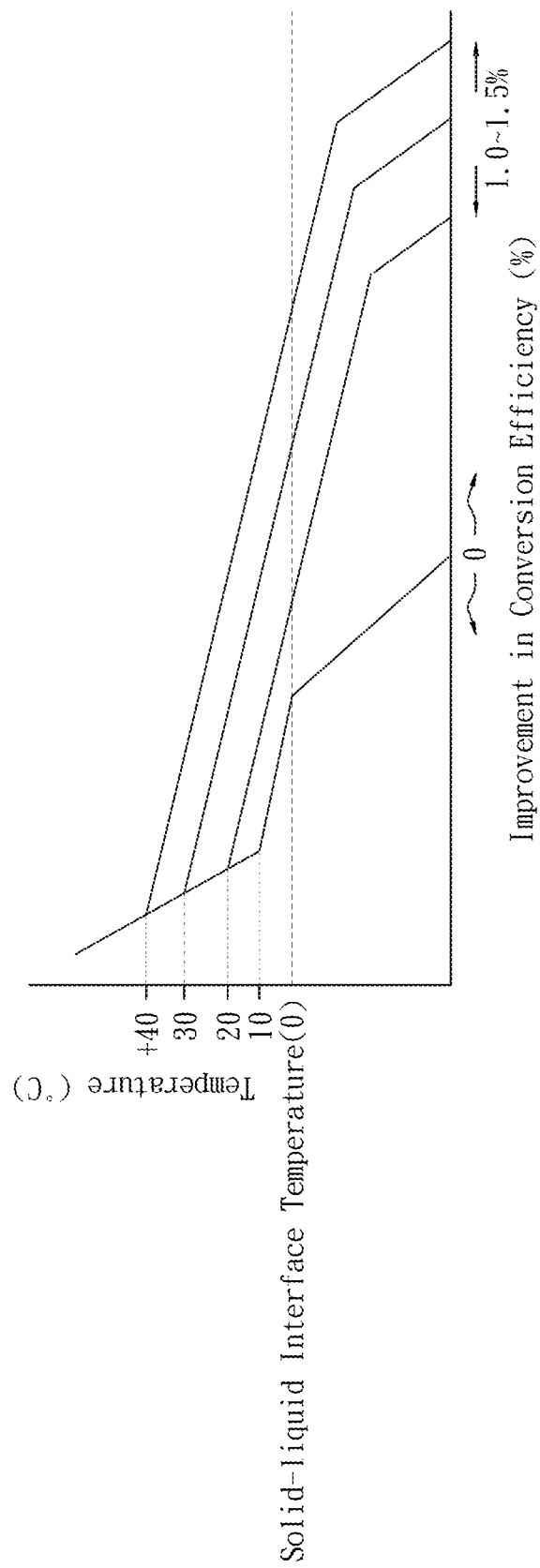
FIG. 3 is a graph illustrating the relationship between cooling temperature under power-controlled cooling of the present invention and conversion efficiency. The x-axis is "time". For the individual curves, the leftmost curve is "improvement in conversion efficiency=0%" and the right curves are "improvement in conversion efficiency=1~1.5%".

FIG. 3 is a graph illustrating the temperature of the cooling silicon with time. Increasing the temperature range around which the power cooling is started (right most curves) improves the conversion efficiency compared to the limited use of power cooling (right most curve). The improvement in efficiency of material purified using the extended range of power cooling is 1.0~1.5%. The increased range of temperatures for power cooling increases the silicon grain size, reducing the total impurities trapped at the grain boundaries. The power cooling ideally starts at +20~40° C. above and stops at −20~40° C. below the solid-liquid interface temperature. The fourth purification means adopted by the present invention is the control of vacuum pressure.

Figure 4:
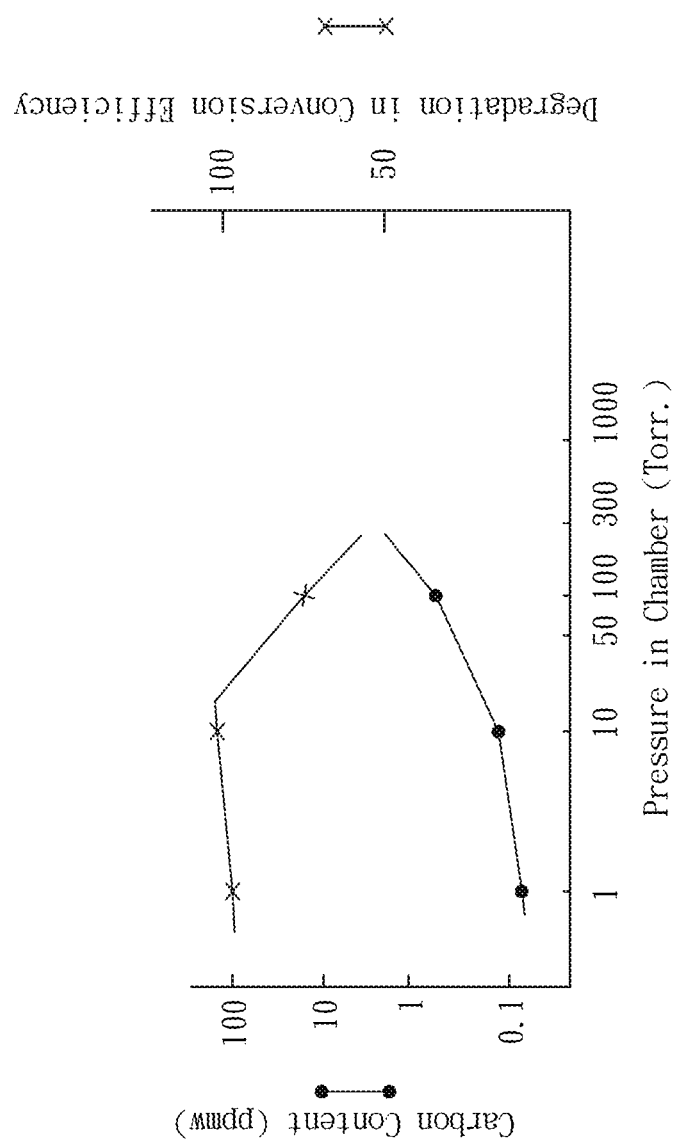
FIG. 4 is a graph illustrating relationships between pressure in a reactor chamber, carbon content, and degradation in conversion efficiency. The right y-axis indicates "Ratio of conversion efficiency in %, with respect to the maximum conversion efficiency at about 20 Torr".

FIG. 4 is a graph illustrating relationships between pressure in the reactor chamber, carbon content, and degradation in conversion efficiency.

The inventor has found through research that degradation in conversion efficiency in solar cells is caused by expansion of crystalline defects in the silicon and less tolerance to impurity contamination, mainly because oxygen and carbon contaminants may vary over time. The inventor also found that when oxygen content in silicon is low, even if carbon content is high, the variation of efficiency in silicon over time is small; when oxygen content in silicon is high, even if carbon content is low, the variation of efficiency in silicon over time is large. From this, it can be assumed that the main cause of degradation in conversion efficiency of solar cells is the oxygen content of the silicon. It is worth noting that excessive carbon content in the silicon also has negative impact on the solar cells, so carbon needs to be eliminated along with oxygen. In order to remove carbon in the silicon, the temperature has to be raised to above 3000° C., which is difficult. Thus, there is a need for a simple method for removing both oxygen and carbon contained in the silicon.

Carbon in the silicon melt is usually introduced as hydrocarbons contained in inert gas (e.g., argon gas) for preventing oxidation of the melt during the manufacturing process. Also, vacuum leaks in the reactor allows oxygen to penetrate and react with the high-temperature carbon components in the device to form CO and $CO_2$, which contact and diffuse into the silicon melt, such that carbon is introduced into the melt. Oxygen is basically supplied from the quartz crucible ($SiO_2$) to the silicon melt when they are in contact with each other. Therefore, if one can make the thus generated oxygen and carbon contact each other in the crucible (1) and form CO and $CO_2$, these gases can be pumped out, and the oxygen and carbon in the melt could be reduced.

In order to react the oxygen and carbon efficiently in the silicon melt, the present invention uses the heat circulation induced by temperature gradients in the melt. As a result, oxygen and carbon are both reduced.

The inventor has found through experiments an example of conversion efficiency can be obtained by performing pressure control under the following conditions:
Pressure: 1 Torr
Purified Carbon Content: 0.1 ppma
Time: 5 hours In comparison, a pressure of 300 Torr is traditionally kept in the reactor chamber, and the carbon content is 5 ppma. See, for example, FIG. 3.

The conversion efficiency of a solar cell made from silicon with the low carbon and oxygen content produced by this control method can obtain an improvement of 50% compared to a chamber kept at low pressure.

The relationships between the actual pressure inside the chamber, carbon content, and degradation in conversion efficiency are shown in FIG. 4. As depicted by the graph, under lower pressure, since the interface between the silicon melt and the crucible (1) provides a large amount of oxygen, carbon in the silicon combines with oxygen to form carbon monoxide and dioxide gas (CO and $CO_2$, respectively), which is released, and thus the carbon content is reduced and the conversion efficiency increased; that is, when supplying oxygen from the crucible (1) is desired and the chamber pressure is kept at a low pressure of 1 Torr, the interface between the silicon melt and the quartz crucible will abruptly produce a large amount of oxygen, and when the pressure is controlled at a higher pressure region of 50 Torr, carbon and oxygen more easily combine and form CO and $CO_2$. The oxygen and carbon contents in the chamber are thus removed by changing the pressure, thereby improving the conversion efficiency.

The fifth purification means adopted by the present invention is the upward venting of exhaust.

Figure 5:
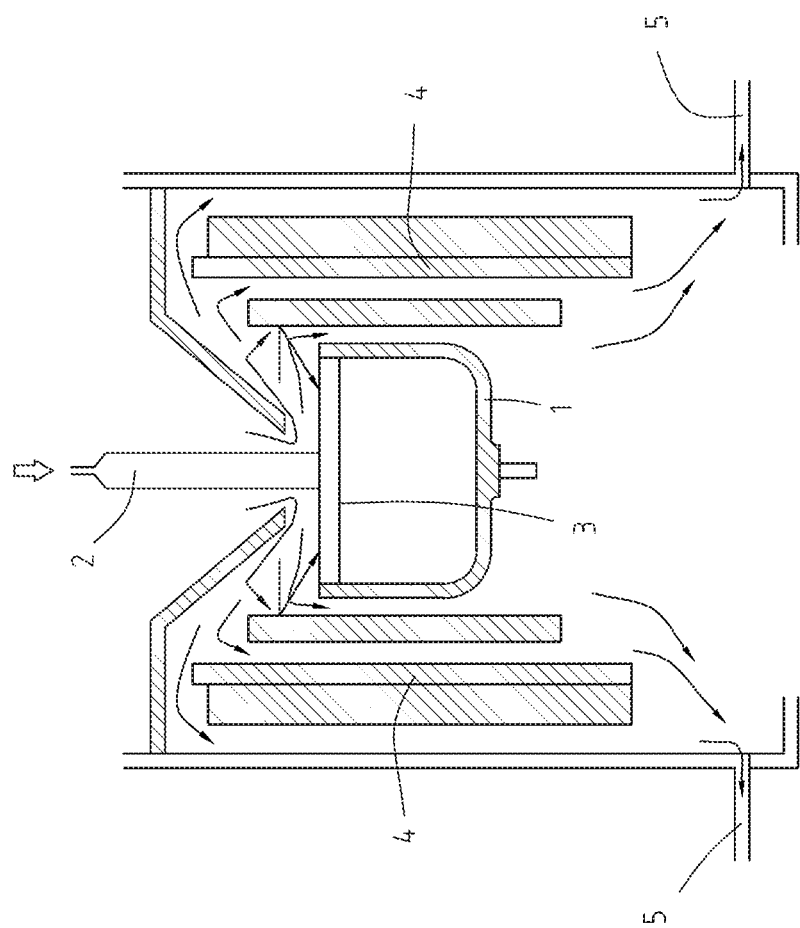
FIG. 5 is a schematic diagram depicting the flow of exhaust in a traditional reactor chamber.
Figure 6:
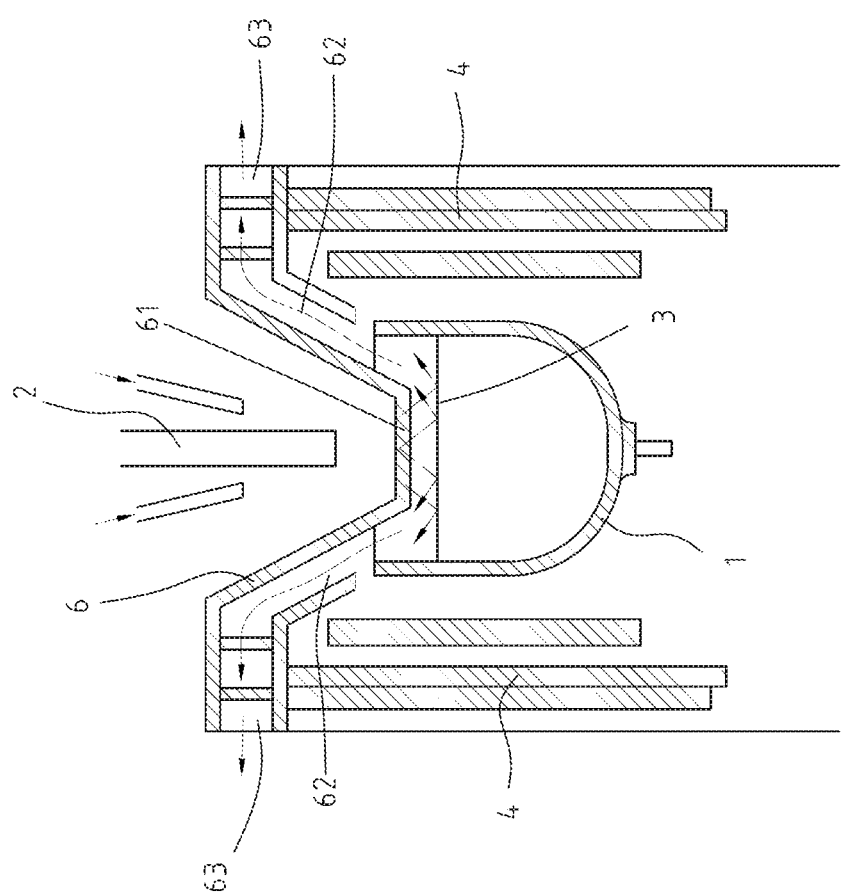
FIG. 6 is a cross-sectional diagram depicting a venting device according to the present invention and the resulting flow of exhaust in the reactor chamber.

FIG. 5 is a schematic diagram depicting the traditional flow of exhaust in the reactor chamber. FIG. 6 is a schematic diagram depicting the venting device according to the present invention and the resulting flow of exhaust in the reactor chamber.

The crystalline silicon used in solar cells is typically processed by a single-crystal-pulling device or a casting reactor into suitable shapes. Based on structural reasons, purifying gases are provided from the top of the reactor to the silicon melt, and exhaust is let out from underneath. Thus the purifying gases contact the surface of the silicon melt while rising through other flow paths, and then pass through the carbon components before being let out from underneath.

As shown in FIG. 5, an exhaust flow path in a conventional reactor is shown. The reactor is supplied with gases required for purification from an injecting tube (2) above the crucible (1) to the surface of the silicon melt (3), and exhaust generated (as shown by arrows) rises through the flow paths in the reactor and passes between the carbon components (4) in the reactor and is let out through exhaust pipes (5). However, since the exhaust that comes into contact with the carbon components (4) contains water, the water will oxidize the carbon components (4) and reduce their lifespan. In addition, since the exhaust also contains CO and $CO_2$, they may be brought back to the silicon melt (3) through back-diffusion, contaminating the silicon with carbon.

The present invention prevents carbon increase in the silicon by venting the exhaust upward and laterally instead of downward. As shown in FIG. 6, a specially designed V-shape venting device (6) allows exhaust (shown by the arrows) generated in the silicon melt (3) in the crucible (1) to be vented upward and laterally out of the reactor, preventing CO and $CO_2$ in the exhaust from flowing back toward and contaminating the silicon melt (3). The carbon content in the silicon melt is reduced by 20% or more compared to downward venting. Also, the non-uniformity of carbon content in product batches is reduced by 30% or more. Compared to downward venting, other effects achieved by this high-temperature venting include efficiently utilizing the high-temperature exhaust through heat exchangers, electrical generators, or combinations thereof, for other uses, thus enhancing the overall thermal efficiency. In addition, using the above method, water contained in the exhaust will not contact and oxidize the carbon components (4) in the reactor and reduce their lifespan.

In order to achieve the above goal, the present invention provides an upward and lateral venting device (6) positioned above the crucible (1). The venting device (6) has an roughly V-shaped path, including a horizontal reflecting part (61) approximately parallel to the surface of the silicon melt (3) at the bottom of the V structure, guiding grooves (62) slanting upward from either end of the horizontal reflecting part (61), and lateral grooves (63) extending horizontally to either end above the guiding grooves (62). Through such a design, when the reactor produces exhaust, it will be concentrated and reflected by the horizontal reflecting part (61) towards the guiding grooves (62) at both ends. Due to the principle of elevation of high-temperature exhaust, exhaust will be guided in the guiding grooves (62) towards the above lateral grooves (63) at both ends, and from there it will be vented out of the reactor through the above horizontally extending lateral grooves at both ends. In this way, exhaust will not flow back towards and diffuse into the silicon melt (3), ensuring the quality of the purified silicon. In addition, exhaust will not be in contact with the carbon components (4) of the device, which would otherwise shorten the lifespan of the device due to oxidation.

The sixth purification means adopted by the present invention is the isolation by high-pressure gas jet.

In the purification process using low-purity metallurgical silicon as the starting material, impurities react with gases and/or materials used in purification to vaporize or become vitrified to form slag floating on the surface of the silicon melt (3).

Impurities floating on the surface of the silicon melt (3) may hinder purification during continuous purification processes. For example, in Taiwan patent application nos. 098138830 and 099104551 filed by the same applicant, a purification method is proposed in which purifying gases are delivered to the surface of the silicon melt by high-pressure injection tubes, which allows a dimple to be formed on the surface of the melt, thereby increasing the contact area of $H_2O$ and the stirring effect of the heat circulation. However, the floating substances formed by vitrified impurities in the silicon melt may hinder the operation of the high-pressure purifying gases and thus should be eliminated.

Figure 7B:
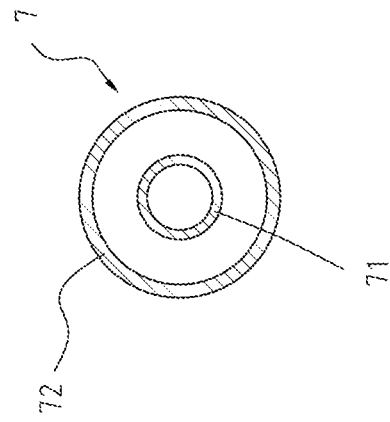
FIG. 7(b) is a diagram depicting a cross section of the concentric high-pressure injection device of the present invention.
Figure 7A:
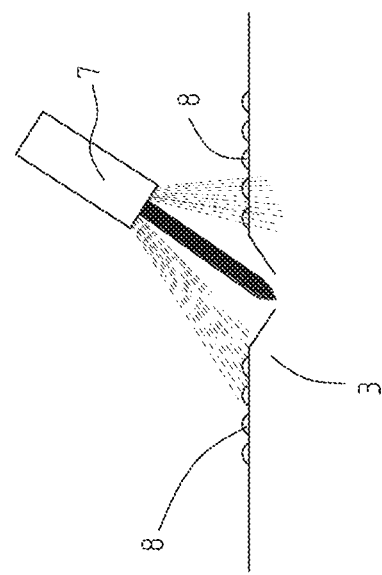
FIG. 7(a) is a diagram illustrating the position of a concentric high-pressure injection device of the present invention with respect to the surface of the silicon melt in the crucible.

As shown in FIGS. 7(a) and 7(b), the present invention proposes a concentric high-pressure injection device (7), including an inner tube (71) and an outer tube (72), positioned above the surface of the silicon melt (3) at an angle. The inner tube (71) provides gases and/or materials necessary for purification to the center of the silicon melt (3) in a straight line, so that impurities in the melt (3) will react and vaporize or form slag (8) floating on the surface of the melt (3). At the same time, the outer tube (72) supplies high-pressure injection gas to the silicon melt (3) to effectively blow the slag (8) away from the surface center, allowing gases and/or materials necessary for purification provided by the inner tube (71) to successfully reach the center of the silicon melt (3), thereby facilitating purification by forming a dimple. Using this method, the purification efficiency can be effectively increased by 30% or more.

The seventh purification means adopted by the present invention is carbon removal by sandblasting.

In order to prepare low-purity metallurgical silicon as the raw material for manufacturing solar-grade silicon, an impurity attached or adhering to the metallurgical silicon raw material will need to be removed, which presents some challenges in the actual implementation.

In general, low-purity metallurgical silicon is produced by reducing quartz and carbon at high temperature. The main component of quartz is silica ($SiO_2$). Carbon is used as a reducing agent to produce silicon from silica. The carbon source is usually a product of coal or petroleum, such as pitch, tar, or asphalt. At high temperature, silica reacts with carbon in a reduction process to form metallurgical silicon.

Figure 8B:
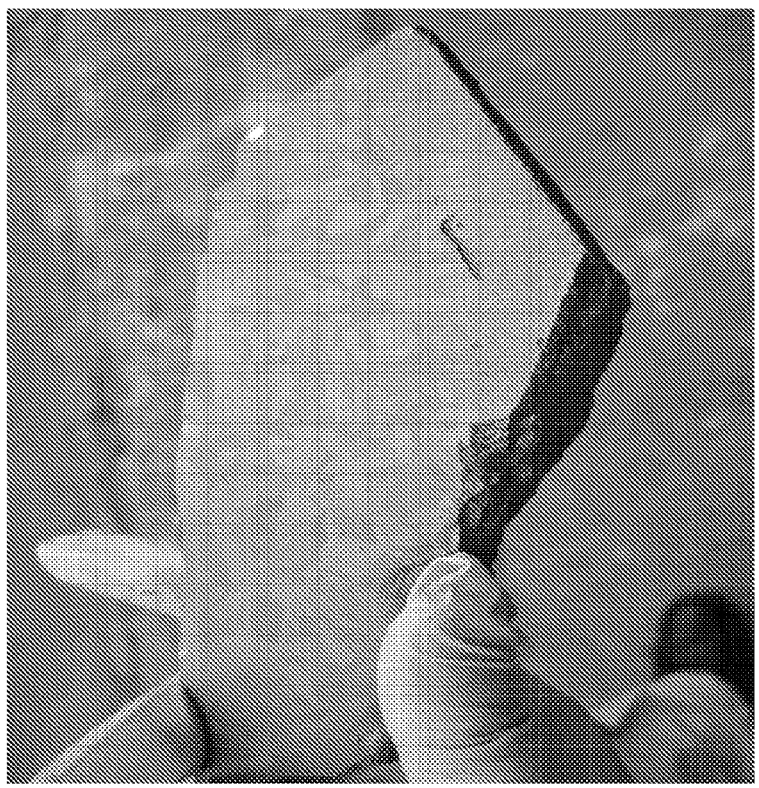
FIG. 8(b) is a photograph of metallurgical silicon raw material after removal of carbon by sandblasting of the present invention.
Figure 8A:
FIG. 8(a) is a photograph of metallurgical silicon raw material before removal of carbon by sandblasting of the present invention.
Figure 9:
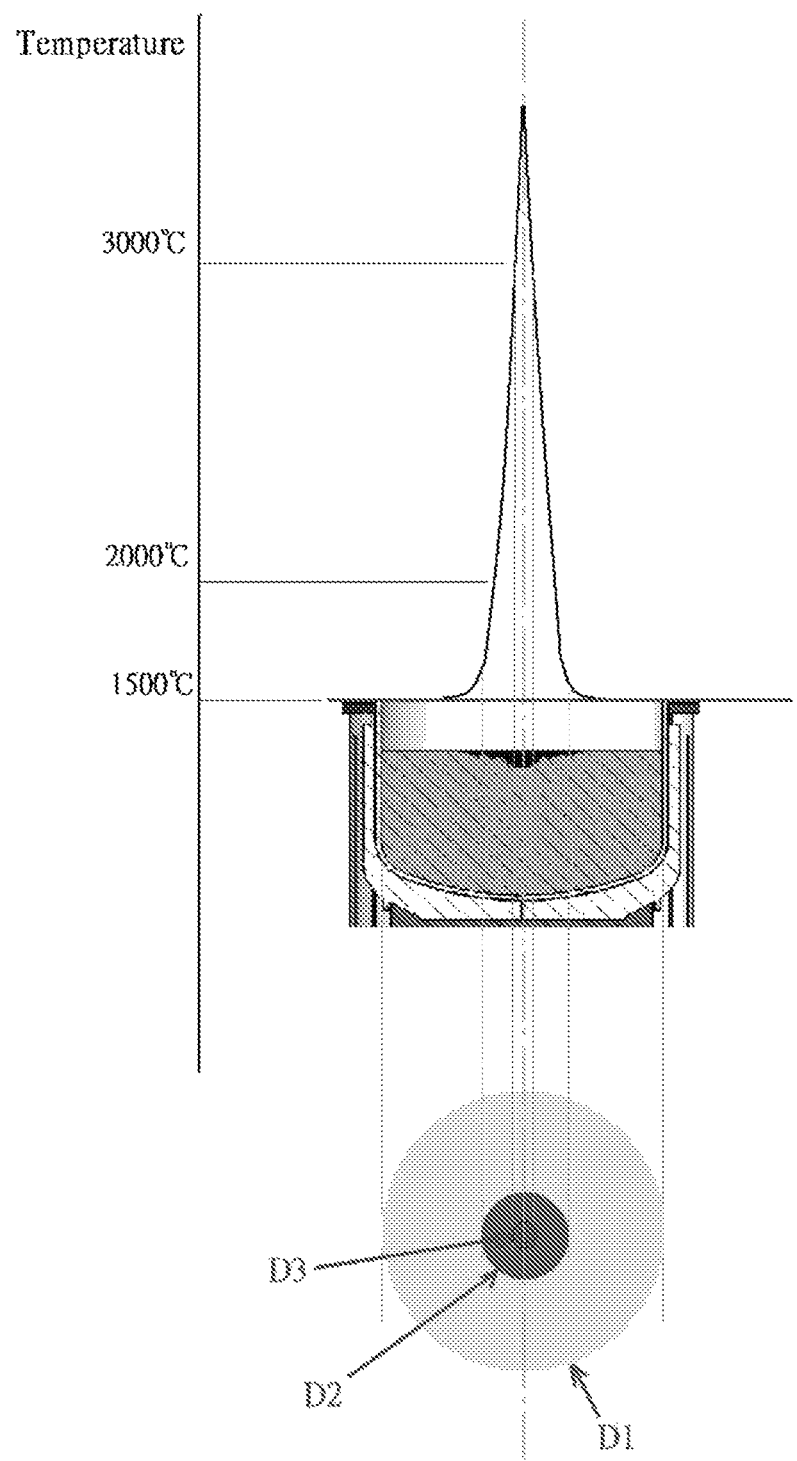
FIG. 9 shows the temperature profile under arc heater irradiation.

In this process, a carbon raw material is added in a quantity that is more than needed for reducing silica. The carbon raw material is attached to the metallurgical silicon in the form of unreacted carbon. When this unreacted carbon flows out of the reactor, some will react with oxygen in the air to form gases such as CO and $CO_2$ and diffuse into the air, and those gases not coming into contact with the air will solidify as bubbles on the surface of the metallurgical silicon. As a result, when flowing out of the reactor, the top surface of the metallurgical silicon will appear to be porous, due to the attached carbon raw materials. FIG. 8(a) is a photograph of a grown low-purity metallurgical silicon raw material without carbon removal. The photograph shows that the carbon raw material is attached to the surface of the metallurgical silicon in the form of bubbles.

When this metallurgical silicon raw material with the carbon raw material attached is inserted into the crucible for heating and pressure reduction for purification, the coal will decompose and release sulfur along with carbon, which will contaminate the reactor apparatus to the extent that some parts of the process will need to be suspended.

In order to overcome this, usually before the purification process, those metallurgical silicon raw materials with the carbon raw material attached are discarded manually. However, this approach not only is time-consuming but also reduces the yield of the purification process, resulting in a higher price of the metallurgical silicon raw materials.

To solve this problem, the present invention uses a sandblasting technique to remove the solidified bubbles on the top of a low-purity metallurgical silicon raw material, thereby avoiding the release of sulfur from coal decomposition and contamination of the apparatus during the purification process, and eliminating manual filtering and waste of the materials.

The sandblasting of the present invention uses glass powder as the blasting material. The particle size of the powder selected is No. 20 to 30 MESH, and a good blasting effect can be realized at a blasting pressure of 5~8 kg/cm$^2$. After sandblasting, the carbon raw material attached to the surface of the metallurgical silicon raw material can be effectively removed, as shown in a photograph of metallurgical silicon after sandblasting in FIG. 8(b). Using such technique, waste of metallurgical material can be avoided, yield can be increased, and production cost can be reduced.

In a specific embodiment, the present invention provides for a method and apparatus illustrating a temperature profile under arc heater irradiation. We have demonstrated that oxygen will be supplied by the crucible. When the silicon (Si) is saturated with oxygen, diffusion of oxygen from the crucible into the Si will stop. Of course, there can be other variations, modifications, and alternatives.

In an alternative specific embodiment, process pressure is kept at 1.0 Torr and then at 50 Torr. The oxygen concentration in Si changes from 1 E 15/cm3 to 0.5 E 15/cm3. The carbon concentration is reduced from 100 ppm to approximately 0.5 ppm. Again, there can be other variations, modifications, and alternatives.

In still an alternative embodiment, the distance from 8 cm to 15 cm to create the temperature profile is provided. The water volume supply rate is 10 mL/min in this embodiment. The slagging material is CaCl2 and MgCl2 in this embodiment. Glass material as slagging material removes metal impurities as oxides which are formed in a reaction with water, forming a metal oxide:SiO2 glass (MSG). The thickness of the MSG is 1~50 mm. Again, there can be other variations, modifications, and alternatives.

By using one, all or a plurality of the technical means described above in the UMG silicon purification process, further purification and removal of oxygen, carbon, and impurities can be achieved, and the resulting silicon product is capable of meeting the standards for quality and efficiency over time at low production and high yield, completely replacing the traditional metallurgical silicon ingot casting process. In one or more embodiments, the present invention may also includes one or more of the following elements, which have been summarized below.

In a specific embodiment, the present invention provides a method for improving yield of an upgraded metallurgical-grade (UMG) silicon purification process, in the UMG silicon (UMGSi) purification process, in a reaction chamber, performing purification by one, all or a plurality of the following means in the same apparatus at the same time. The means may include, among others, a crucible ratio approach, wherein heat circulation is generated by density variations caused by uneven temperature distribution in a silicon melt in a crucible by designing the effective depth of the crucible to be ½ or more of the diameter of the crucible (circular crucible). The means may also include the addition of water-soluble substances, wherein calcium chloride ($CaCl_2$) and magnesium chloride ($MgCl_2$) of a predetermined weight percent are mixed with water to form a solution, which is then continuously injected into the silicon melt for a predetermined period of time and in a predetermined amount, such that the solution combines with the silicon oxide in the silicon melt and vitrifies, floating on the surface the silicon melt along with other impurities, thereby eliminating crystalline defects and reducing issues with time-varying electromotive force (EMF) of silicon products. The control of power, wherein the crucible is heated to approximately 1470° C., a heater's output power is controlled in this temperature region rather than using temperature control, that is, the silicon melt is cooled by controlling the power at a very slow continuously cooling rate, so that the solidified silicon after cooling down is easily removed from the quartz crucible due to changes in the expansion coefficient of the crucible, and a material is also optionally coated on the contact interface between the quartz crucible and the silicon melt for protecting the silicon melt against contamination from the crucible. The control of vacuum pressure, wherein the pressure in the reactor chamber is controlled so that carbon contained in the silicon melt and oxygen released by the quartz crucible combine to form carbon oxide gas (CO and $CO_2$) that can be easily vented outside the chamber, thereby removing oxygen and carbon contained in the silicon melt. The upward venting of exhaust, wherein exhaust generated in the reactor chamber during the purification process is vented upward and laterally through vent on top of the crucible to avoid backflow of carbon oxide exhaust gases (CO and $CO_2$) toward the silicon melt, and to avoid water in the exhaust contacting and oxidizing carbon components of the reactor. The means also include isolation by high-pressure gas jet, wherein, by means of an injection device composed of two concentric tubes, necessary purifying substances are provided at an angle with high pressure to the center of the silicon melt, pushing slag away from the center of the silicon melt so that the purifying substances are effectively delivered to the silicon melt and carbon removal by sandblasting, wherein porous carbon raw material in the form of bubbles that is solidified and attached to the bottom of low-purity metallurgical silicon raw material is removed by sandblasting.

Depending upon the embodiment, the effective depth of the crucible in the crucible ratio approach is ½ or more of the length of the shortest side of the crucible surface (polygonal crucible). Additionally, the $CaCl_2$ and $MgCl_2$ of weight percent of 0.1% are mixed in water to form the solution, and the solution is continuously injected into the 10-kg silicon melt at a speed of 10 cc/min for a specified period of time. The cooling rate in the control of power means is 0.1~0.01° C./min in a specific embodiment In a specific embodiment, the temperature region in the control of power means is ±40° C. from the solid-liquid interface temperature of the silicon melt.

In a specific embodiment, the material coated on the contact interface between the quartz crucible and the silicon melt in the control of power means is silicon nitride powder. The, in the control of vacuum pressure means, under lower pressure, since the interface between the silicon melt and the quartz crucible provides a large amount of oxygen, carbon contained in silicon combines with oxygen to form carbon oxide gas (CO and $CO_2$), which is released, and the carbon content is reduced and the conversion efficiency increased. In a specific embodiment, in the control of vacuum pressure means, when the chamber pressure is kept at 10~50 Torr for a specified period of time, the carbon content in the silicon melt is reduced to 0.1~1 ppmw. As an example, See FIG. 4.

In the isolation by high-pressure gas jet means, the high-pressure injection device includes an inner tube and an outer tube, and is positioned above the surface of the silicon melt at an angle; wherein the inner tube provides gases and/or materials necessary for purification to the center of the silicon melt in a straight line, so that impurities in the melt will react and vaporize or form slag floating on the surface of the melt; and meanwhile, the outer tube supplies high-pressure injection gas to the silicon melt to effectively blow the slag away from the surface center, allowing gases and/or materials necessary for purification provided by the inner tube to successfully reach the center of the silicon melt, thereby facilitating acceleration of purification by forming a dimple. In a specific embodiment, the sandblasting material means is glass powder, and the particle size of the powder selected is No. 20 to 30 MESH, and sandblasting is performed at a blasting pressure of 5~8 $Kg/cm^2$.

An exhaust venting device that is applicable to the upward venting of exhaust means in claim 1 for venting exhaust in an upward and lateral fashion, the exhaust venting device being designed to have a V-shaped path located on top of the crucible, including a horizontal reflecting part approximately parallel to the surface of the silicon melt at the bottom of the venting device, guiding grooves slanting upward from either end of the horizontal reflecting part, and lateral grooves extending horizontally to either end above the guiding grooves; through such a design, exhaust is first concentrated and then reflected by the horizontal reflecting part towards the guiding grooves at both ends, and from there it is vented out of the reactor through the above horizontally extending lateral grooves at both ends.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for forming high quality silicon material for photovoltaic devices, the method comprising:
    transferring raw silicon material and a plurality of carbon species in a crucible having an interior region, the crucible being made of a quartz material, the quartz material being capable of withstanding a temperature of at least 1400° C.;
    subjecting the raw silicon material in the crucible to thermal energy to cause the raw silicon material to be melted into a liquid state to form a melted material at a temperature greater than 1400° C., the melted material having an exposed region bounded by the interior region of the crucible;
    subjecting an exposed inner region of the melted material to an energy source comprising an arc heater configured above the exposed region and spaced by a gap between the exposed region and a muzzle region of the arc heater to cause formation of a temperature profile within a vicinity of an inner region of the exposed melted material while maintaining outer regions of the melted material at a temperature below a melting point of the quartz material of the crucible;
    providing a plasma stream through a concentric high-pressure injection device configured at an angle, the concentric high-pressure injection device having an inner tube and an outer tube, the plasma stream being provided through the inner tube in a straight line, the plasma stream having a velocity of greater than 1 meter per second and being provided within a vicinity of the exposed inner region of the melted material;
    introducing a water species comprising a slagging material into the stream of the plasma;
    interacting the water species and a portion of the melted material to cause formation of a glass material to absorb one or more metal impurities from the melted material to form a thickness of the glass material in the crucible;
    providing a high-pressure injection gas through the outer tube of the concentric high-pressure injection device, wherein the high-pressure injection gas is provided in a direction that forms an acute angle with the straight line to blow the glass material away; and
    removing the thickness of the glass material.

2. The method of claim 1 wherein the stream of the plasma is provided by outputting an inert gas through a nozzle region to cause a dimple region within a vicinity of the center region of the melted material.

3. The method of claim 2 wherein the inert gas comprises an argon gas characterized by a flow rate suitable to form the dimple region, and wherein the method further comprises maintaining a boundary region between the exposed inner region and the interior region of the crucible.

4. The method of claim 2 wherein the nozzle region is coupled to an argon gas source, the nozzle region comprising a ceramic material.

5. The method of claim 2 wherein the dimple region provides an increased surface region for a plume to interact with the melted material; wherein the dimple region has a depth of at least one centimeter.

6. The method of claim 2 wherein the melted material comprises a viscosity of 0.7 Pascal-second.

7. The method of claim 1 further comprising providing a cover gas to maintain the melted material within the crucible.

8. The method of claim 1 further comprising providing a carrier gas configured to cause a portion of evaporated melted material to return to the melted material.

9. The method of claim 1 further comprising subjecting the raw silicon to a sandblasting process to remove carbon raw material from the surface of the raw silicon.

10. The method of claim 1 further comprising heating the crucible to about 1470° C. and cooling the silicon melt through controlling the heater's output power to provide a slow continuous cooling rate, allowing the cooled solidified silicon to be easily removed from the quartz crucible due to changes in the expansion coefficient of the crucible.

11. The method of claim 1 wherein the melted material comprises a resulting phosphorous species of 1 ppm and less.

12. The method of claim 1 wherein the thickness of glass material comprises silicon dioxide or aluminum dioxide.

13. The method of claim 1 wherein one or more metal impurities is one of copper, iron, manganese, nickel, aluminum, cobalt, chromium, or titanium.

14. The method of claim 1 wherein the thickness of glass material comprises an $FeO_y$ species.

15. The method of claim 1 wherein the slag material is selected from a group consisting of $CaCl_2$ and $MgCl_2$.

16. The method of claim 1 wherein the slag material is water soluble.

17. The method of claim 1 wherein the water species is H2O in liquid form.

18. The method of claim 1 wherein the crucible comprises a width and a depth to facilitate a mixing action within the exposed inner region and reduce a mixing action within the exposed outer region of the melted material; wherein the depth to the width has an aspect ratio of 2:1 or greater.

19. The method of claim 1 wherein the thickness of the glass material is floating overlying a portion of the melted material.

20. A method for forming high quality silicon material for photovoltaic devices, the method comprising:

transferring raw silicon material and a plurality of carbon species in a crucible having an interior region, the crucible being made of a quartz material, the quartz material being capable of withstanding a temperature of at least 1400° C.;

subjecting the raw silicon material in the crucible to thermal energy to cause the raw silicon material to be melted into a liquid state to form a melted material at a temperature greater than 1400° C., the melted material having an exposed region bounded by the interior region of the crucible;

subjecting an exposed inner region of the melted material to an energy source comprising an arc heater configured above the exposed region and spaced by a gap between the exposed region and a muzzle region of the arc heater to cause formation of a temperature profile within a vicinity of an inner region of the exposed melted material while maintaining outer regions of the melted material at a temperature below a melting point of the quartz material of the crucible;

providing a plasma stream through a concentric high-pressure injection device configured at an angle, the concentric high-pressure injection device having an inner tube and an outer tube, the plasma stream being provided through the inner tube, the plasma stream having a velocity of greater than 1 meter per second and being provided within a vicinity of the exposed inner region of the melted material;

providing a high-pressure injection gas through the outer tube of the concentric high-pressure injection device;

introducing a water species comprising a slagging material into the stream of the plasma;

interacting the water species and a portion of the melted material to cause formation of a glass material to absorb one or more metal impurities from the melted material to form a thickness of the glass material in the crucible;

removing the thickness of the glass material; and removing exhaust generated in the reactor chamber during the purification process in an upward manner via a venting device to prevent remixing of the exhaust with a portion of the melted material, the venting device having a V-shaped path and including a horizontal reflecting part, a plurality of guiding grooves, and a plurality of lateral grooves coupled to the guiding grooves, the guiding grooves being coupled to the horizontal reflecting part.

* * * * *